(12) United States Patent
Ishii et al.

(10) Patent No.: US 7,446,581 B2
(45) Date of Patent: Nov. 4, 2008

(54) SEMICONDUCTOR INTEGRATED CIRCUIT WITH A LOGIC CIRCUIT INCLUDING A DATA HOLDING CIRCUIT

(75) Inventors: Chihiro Ishii, Ichihara (JP); Toshikazu Sei, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 11/245,616

(22) Filed: Oct. 7, 2005

(65) Prior Publication Data
US 2006/0082404 A1    Apr. 20, 2006

(30) Foreign Application Priority Data
Oct. 15, 2004    (JP) .............................. 2004-301747

(51) Int. Cl.
*H03K 3/356* (2006.01)
(52) U.S. Cl. ..................... 327/210; 327/212; 327/218
(58) Field of Classification Search ................ 327/210, 327/212, 218
See application file for complete search history.

(56) References Cited

U.S. PATENT DOCUMENTS

| 5,081,377 | A | * | 1/1992 | Freyman | 327/198 |
| 5,504,703 | A | * | 4/1996 | Bansal | 365/156 |
| 5,525,923 | A | * | 6/1996 | Bialas et al. | 327/210 |
| 5,654,659 | A | * | 8/1997 | Asada | 327/208 |
| 6,026,011 | A | * | 2/2000 | Zhang | 365/154 |
| 6,100,730 | A | * | 8/2000 | Davis et al. | 327/117 |
| 6,275,080 | B1 | * | 8/2001 | Phan et al. | 327/200 |
| 6,348,825 | B1 | * | 2/2002 | Galbi et al. | 327/218 |
| 6,462,596 | B1 | * | 10/2002 | Varma | 327/218 |
| 6,621,318 | B1 | * | 9/2003 | Burr | 327/218 |
| 6,794,916 | B1 | * | 9/2004 | Varma | 327/218 |
| 6,970,017 | B2 | * | 11/2005 | Akita et al. | 326/113 |
| 7,145,365 | B2 | * | 12/2006 | Kumata | 326/93 |
| 7,167,033 | B2 | * | 1/2007 | Arima et al. | 327/208 |
| 7,301,382 | B2 | * | 11/2007 | Osame et al. | 327/218 |

FOREIGN PATENT DOCUMENTS

JP    2003-273709    9/2003

* cited by examiner

*Primary Examiner*—Kenneth B. Wells
(74) *Attorney, Agent, or Firm*—DLA Piper LLP (US)

(57) ABSTRACT

A semiconductor integrated circuit includes a first data holding section, a first pull-up circuit, a first pull-down circuit, a first feedback circuit, and a second feedback circuit. The first data holding section holds first output data. The first pull-up circuit takes in input data as a pull-up control signal and, when the pull-up control signal takes one value, pulls up the first output data. The first pull-down circuit takes in the input data as a pull-down control signal and, when the pull-down control signal takes the other value, pulls down the first output data. The first feedback circuit feeds back a first feedback signal corresponding to the first output data as the pull-up control signal to the first pull-up circuit. The second feedback circuit feeds back a second feedback signal corresponding to the first output data as the pull-down control signal to the first pull-down circuit.

12 Claims, 5 Drawing Sheets

SEMICONDUCTOR INTEGRATED CIRCUIT WITH A LOGIC CIRCUIT INCLUDING A DATA HOLDING CIRCUIT

CROSS-REFERENCE TO RELATED APPLICATIONS

This application is based upon and claims the benefit of priority from prior Japanese Patent Application No. 2004-301747, filed Oct. 15, 2004, the entire contents of which are incorporated herein by reference.

BACKGROUND OF THE INVENTION

1. Field of the Invention

This invention relates to a semiconductor integrated circuit, and more particularly to a semiconductor integrated circuit with a logic circuit including a data holding circuit, such as a latch circuit or a flip-flop, which has reduced the occurrence of soft errors caused by, for example, a rays or neutron radiation.

2. Description of the Related Art

Soft errors in a semiconductor device caused by a rays or neutron radiation have been acknowledged as a problem in the semiconductor devices installed in the equipment used mainly in the space field and in the aircraft field. In a memory cell, there has been provided an error-correction code to detect and correct a soft error, even if a soft error has occurred.

In recent years, with the higher integration and further miniaturization of semiconductor devices, the parasitic capacitance of a cell becomes small to the extent that the occurrence of a soft error cannot be ignored even in a semiconductor device used on earth. Therefore, even in a logic circuit, measures should be taken against soft errors. In a circuit for holding data, such as a latch circuit or a flip-flop, if the held data is inverted and the inverted data is held, the inverted data propagates and has a greater effect on the operation of the chip. Therefore, measures against soft errors in the data holding circuit are required.

As for measures against soft errors in a data holding circuit, circuits provided with the measures have been disclosed in Jpn. Pat. Appln. KOKAI Publication No. 2003-273709 (hereinafter, referred to as reference 1). The configuration of each of the circuits is such that the held data is corrected on the basis of the fact that only an error from "0" to "1" occurs in a p-channel MOS transistor and that only an error from "1" to "0" occurs in an n-channel MOS transistor.

The circuit configurations shown in FIGS. 6 and 25 in reference 1 are dynamic data holding circuits. It is expected that the data is not retained by parasitic capacitance and that the data is not changed by a leakage current in the transistor. However, in dynamic data holding circuits, the stability changes according to the value of the parasitic capacitance or to the magnitude of a leakage current in the transistor. If the parasitic capacitance is small, or if a leakage current in the transistor is large, the data can be changed in the very worst case.

In contrast, in a static data holding circuit, since either "0" or "1" is always held in a loop circuit composed of a feedback circuit, the holding circuit is very stable against parasitic capacitance and a leakage current in the transistor. However, the circuits shown in FIGS. 8 and 12 in reference 1, which are formed of static data holding circuits, have the problem of having a complex configuration and a large circuit size because a large number of transistors have been used.

BRIEF SUMMARY OF THE INVENTION

According to a first aspect of the present invention, there is provided a semiconductor integrated circuit comprising: a first data holding section which holds first output data; a first pull-up circuit which takes in, as a pull-up control signal, input data input in synchronization with a clock signal and, when the pull-up control signal takes one value, pulls up the first output data held in the first data holding section; a first pull-down circuit which takes in, as a pull-down control signal, the input data input in synchronization with the clock signal and, when the pull-down control signal takes the other value, pulls down the first output data held in the first data holding section; a first feedback circuit which feeds back a first feedback signal corresponding to the first output data held in the first data holding section as the pull-up control signal to the first pull-up circuit; and a second feedback circuit which feeds back a second feedback signal corresponding to the first output data held in the first data holding section as the pull-down control signal to the first pull-down circuit.

According to a second aspect of the present invention, there is provided a semiconductor integrated circuit comprising: a logic circuit which includes a first transistor of a first conductivity type and a second transistor of a second conductivity type; a third transistor of the first conductivity type which receives input data and controls a signal input to the gate of the first transistor included in the logic circuit, a reference voltage being supplied to the gate of the third transistor; and a forth transistor of the second conductivity type which receives the input data and controls a signal input to the gate of the second transistor included in the logic circuit, a power supply voltage being supplied to the gate of the fourth transistor.

According to a third aspect of the present invention, there is provided a semiconductor integrated circuit comprising: a first p-channel MOS transistor which has a first current path and a first gate, first input data being input to one end of the first current path, the other end of the first current path outputting a first control signal, and a reference voltage being supplied to the first gate; a second p-channel MOS transistor which has a second current path and a second gate, the first control signal being input to the second gate, and a power supply voltage being supplied to one end of the second current path; a first n-channel MOS transistor which has a third current path and a third gate, the first input data being input to one end of the third current path, the other end of the third current path outputting a second control signal, and the power supply voltage being supplied to the third gate; a second n-channel MOS transistor which has a fourth current path and a fourth gate, the second control signal being input to the fourth gate; a third p-channel MOS transistor which has a fifth current path and a fifth gate, second input data being input to one end of the fifth current path, the other end of the fifth current path outputting a third control signal, and the reference voltage being supplied to the fifth gate; a fourth p-channel MOS transistor which has a sixth current path and a sixth gate, the third control signal being input to the sixth gate, one end of the sixth current path being connected to one end of the fourth current path of the second n-channel MOS transistor and to the other end of the second current path of the second p-channel MOS transistor, the power supply voltage being supplied to the other end of the sixth current path; a third n-channel MOS transistor which has a seventh current path and a seventh gate, the second input data being input to one end of the seventh current path, the other end of the seventh current path outputting a fourth control signal, and the power supply voltage being supplied to the seventh gate; and a fourth n-channel MOS transistor which has an eighth current path and an eighth gate, the fourth control signal being input to the eighth gate, one end of the eighth current path being connected to the other end of the fourth current path of the second n-channel MOS transistor, and the reference voltage being supplied to the other end of the eighth current path.

DETAILED DESCRIPTION OF THE INVENTION

Figure 1:
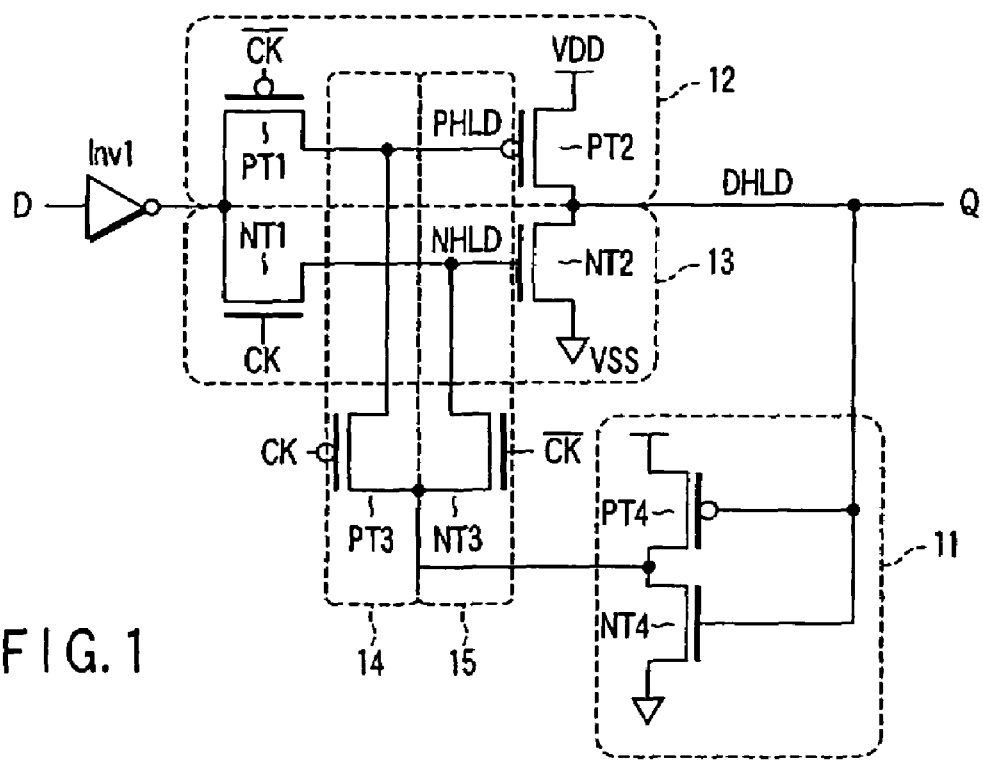
FIG. 1 is a circuit diagram showing the configuration of a static data holding circuit according to a first embodiment of the present invention.

Hereinafter, referring to the accompanying drawings, embodiments of the present invention will be explained. Like parts are designated by corresponding reference characters throughout all of the drawings.

First Embodiment

First, a semiconductor integrated circuit including a static data holding circuit according to a first embodiment of the present invention will be explained.

FIG. 1 is a circuit diagram showing the configuration of a static data holding circuit according to the first embodiment. The static data holding circuit comprises an inverter 11, a pull-up circuit 12, a pull-down circuit 13, a first feedback circuit 14, and a second feedback circuit 15.

The inverter 11 is formed of a p-channel MOS transistor PT4 and an n-channel MOS transistor NT4. The signal at node DHLD the inverter 11 has is output as an output signal Q.

The pull-up circuit 12 includes a first gate circuit and a p-channel MOS transistor PT2. The first gate circuit is formed of a p-channel MOS transistor PT1 which takes in input data D as a pull-up control signal in synchronization with the inverted clock signal /CK obtained by inverting the phase of a clock signal CK and holds the pull-up control signal. In the p-channel MOS transistor PT2, the data held at the node PHLD is input directly to the gate of the transistor PT2. If the input data is "1" and node PHLD takes one value or "0," the transistor PT2 pulls up the node DHLD of the inverter 11.

The pull-down circuit 13 includes a second gate circuit and an n-channel MOS transistor NT2. The second gate circuit is formed of an n-channel MOS transistor NT1 which takes in input data D as a pull-down control signal in synchronization with the clock signal CK and holds the pull-down control signal. In the n-channel MOS transistor NT2, the data held at the node NHLD is input directly to the gate of the transistor NT2. If the input data is "0" and node NHLD takes the other value or "1," the transistor NT2 pulls down the node DHLD of the inverter 11.

The first feedback circuit 14 includes a p-channel MOS transistor PT3 for feeding back the output of the inverter 11 as a control signal for the p-channel MOS transistor PT2 in synchronization with the clock signal CK. The second feedback circuit 15 includes an n-channel MOS transistor NT3 for feeding back the output of the inverter 11 as a control signal for the n-channel MOS transistor NT2 in synchronization with the inverted clock signal /CK.

Hereinafter, the connections of the static data holding circuit shown in FIG. 1 will be described.

Input data D is supplied to the input section of an inverter Inv1. The output section of the inverter Inv1 is connected to one end of the current path of the p-channel MOS transistor PT1 and to one end of the current path of the n-channel MOS transistor NT1. The other end (node PHLD) of the p-channel MOS transistor PT1 is connected to the gate of the p-channel MOS transistor PT2. The other end (node NHLD) of the n-channel MOS transistor NT1 is connected to the gate of the n-channel MOS transistor NT2. An inverted clock signal /CK obtained by inverting the phase of the clock signal CK is supplied to the gate of the p-channel MOS transistor PT1. The clock signal CK is supplied to the gate of the n-channel MOS transistor NT1.

One end of the current path of the p-channel MOS transistor PT2 is connected to one end of the current path of the n-channel MOS transistor NT2 at a junction point (node DHLD). This junction point is connected to the gate of the p-channel MOS transistor PT4 and to the gate of the n-channel MOS transistor NT4. A power supply voltage $V_{DD}$ is supplied to the other end of the current path of the p-channel MOS transistor PT2. A reference voltage $V_{SS}$ (e.g., ground potential) is supplied to the other end of the current path of the n-channel MOS transistor NT2.

One end of the current path of the p-channel MOS transistor PT4 is connected to one end of the current path of the n-channel MOS transistor NT4 at a junction point. This junction point is connected to one end of the current path of the p-channel MOS transistor PT3 and to one end of the current path of the n-channel MOS transistor NT3. The power supply voltage $V_{DD}$ is supplied to the other end of the current path of the p-channel MOS transistor PT4. The reference voltage $V_{SS}$ is supplied to the other end of the current path of the n-channel MOS transistor NT4.

The other end of the current path of the p-channel MOS transistor PT3 is connected to node PHLD. The other end of the current path of the n-channel MOS transistor NT3 is connected to node NHLD. The clock signal CK is supplied to the gate of the p-channel MOS transistor PT3. The inverted clock signal /CK obtained by inverting the phase of the clock signal CK is supplied to the gate of the n-channel MOS transistor NT3.

Figure 6:
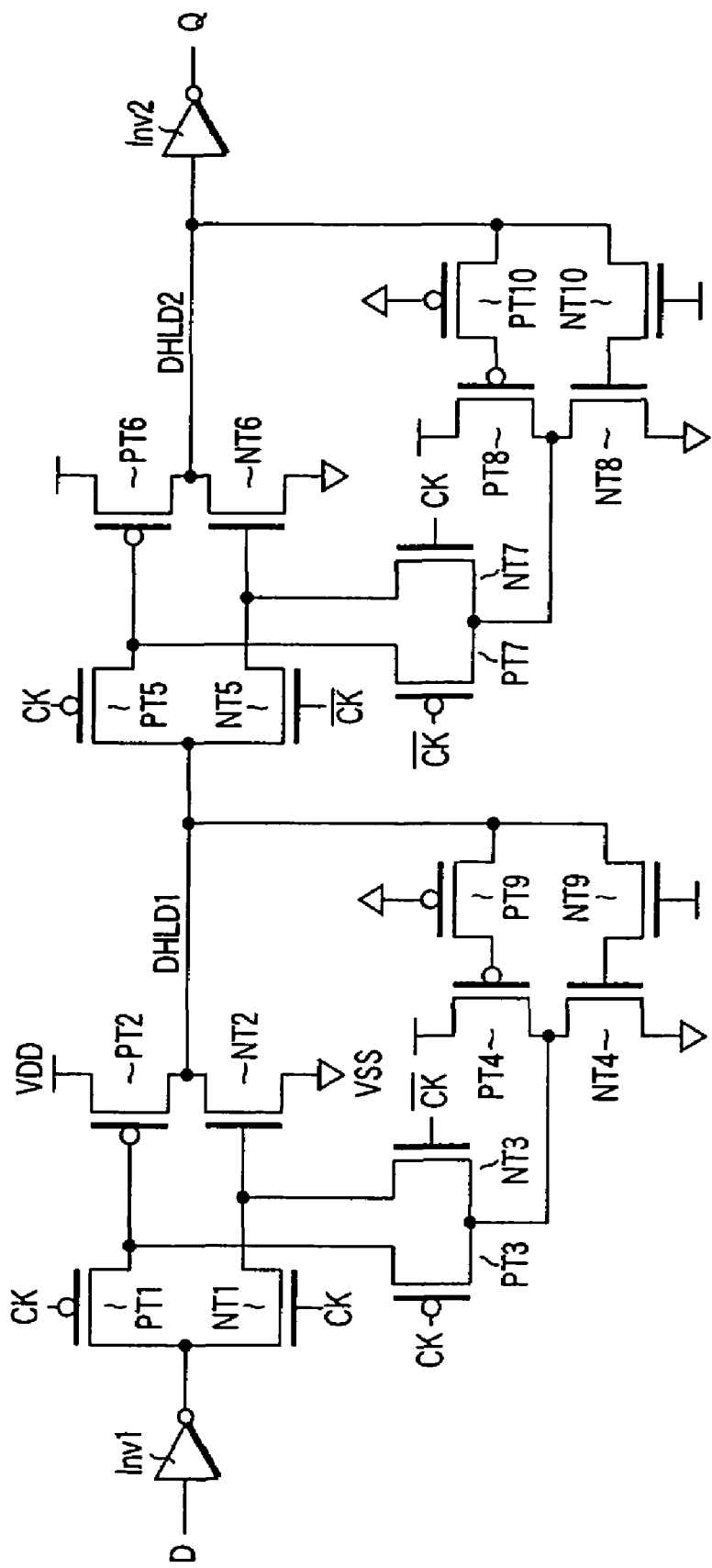
FIG. 6 is a circuit diagram showing the configuration of a flip-flop according to a sixth embodiment of the present invention.

Next, the data holding circuit of the first embodiment shown in FIG. 1 will be compared with a conventional data holding circuit shown in FIG. 6 in reference 1. The data holding circuit of the first embodiment is equal to the circuit formed of an inverter 11, a pull-up route 12, and a pull-down route 13. The CMOS inverter formed of a p-channel MOS transistor PT4 and an n-channel MOS transistor NT4 corresponds to the inverter Inv1 in the back stage of the conventional data holding circuit. However, the output of the CMOS inverter formed of the p-channel MOS transistor PT4 and n-channel MOS transistor NT4 is fed back as a control signal for the p-channel MOS transistor PT2 to pull up the node DHLD via the p-channel MOS transistor PT3 synchronizing with the clock signal OK. The output of the CMOS inverter is also fed back as a control signal for the n-channel MOS transistor NT2 to pull down the node DHLD via the n-channel MOS transistor NT3 synchronizing with the inverted clock signal /CK. That is, the output of the inverter is input to the gate of the p-channel MOS transistor PT2 via the p-channel MOS transistor PT3 and further is input to the gate of the n-channel MOS transistor NT2 via the n-channel MOS transistor NT3. Therefore, the data holding circuit of the first embodiment is a static data holding circuit.

Next, the operation of the data holding circuit according to the first embodiment will be explained.

In the data holding circuit of FIG. 1, the part corresponding to the conventional data holding circuit is the dynamic data holding circuit. If a soft error has occurred in the data at the node DHLD, it is corrected using the data at the node PHLD or node NHLD where no error has occurred.

When the input data D is "1," the data at the node PHLD and node NHLD are "0," which turns on the p-channel MOS transistor PT2 and turns off the n-channel MOS transistor NT2. Here, if the data at the node PHLD has changed from "0" to "1" because of a soft error, the p-channel MOS transistor PT2 changes from on to off, with the result that a soft error can occur at the node DHLD, but no soft error occurs in the data at the node NHLD. The reason is that only an error from "0" to "1" occurs in the p-channel MOS transistor and only an error from "1" to "0" occurs in the n-channel MOS transistor. As described above, if a soft error has occurred in the data at the node PHLD and the data has changed from "0" to "1", the p-channel MOS transistor PT2 changes from on to off. At this time, the n-channel MOS transistor NT2 is off, which brings the node DHLD into the floating state. However, the data is retained by parasitic capacitance or the like.

When the input data is "0," the data at the node PHLD and node NHLD are "1," which turns off the p-channel MOS transistor PT2 and turns on the n-channel MOS transistor NT2. In this case, if the data at the node NHLD changes from "1" to "0" because of a soft error, the n-channel MOS transistor NT2 changes from on to off, with the result that a soft error can occur at the node DHLD, but no soft error occurs in the data at the node PHLD. As described above, the reason is that only an error from "0" to "1" occurs in the p-channel MOS transistor and an error from "1" to "0" does not occur. Therefore, if a soft error has occurred in the data at the node NHLD and the data has changed from "1" to "0", the n-channel MOS transistor NT2 changes from on to off. At this time, the p-channel MOS transistor PT2 is off, which brings the node DHLD into the floating state. However, the data is held by parasitic capacitance or the like.

To realize a static data holding circuit, the data holding circuit of FIG. 1 includes a first feedback circuit 14 and a second feedback circuit 15. When the p-channel MOS transistor PT1 and n-channel MOS transistor NT1 which take in the input data D are off, the p-channel MOS transistor PT3 and n-channel MOS transistor NT3 constituting the first and second feedback circuits 14, 15 respectively go on, which forms a loop from the node DHLD to node PHLD or node NHLD.

When the output of the CMOS inverter formed of the p-channel MOS transistor PT4 and the n-channel MOS transistor NT4 is "0," the data at the node PHLD and node NHLD are "0." This turns on the p-channel MOS transistor PT2 and further turns off the n-channel MOS transistor NT2, with the result that the data at the node DHLD is "1." At this time, the p-channel MOS transistor PT4 goes off and the n-channel MOS transistor NT4 goes on. As a result, the output of the CMOS inverter becomes "0" again. Consequently, "0" is held stably.

When the output of the CMOS inverter is "1," the data at the node PHLD and node NHLD are "1." This turns off the p-channel MOS transistor PT2 and further turns on the n-channel MOS transistor NT2, with the result that the data at the node DHLD is "0." At this time, the p-channel MOS transistor PT4 goes on and the n-channel MOS transistor NT4 goes off. As a result, the output of the CMOS inverter becomes "1" again. Consequently, "1" is held stably.

In the data holding circuit of the first embodiment shown in FIG. 1, the transistors necessary to change a dynamic data holding circuit to a static data holding circuit are only two transistors, the p-channel MOS transistor PT3 and the n-channel MOS transistor NT3. That is, the data holding circuit of the first embodiment can be configured using a smaller number of transistors than that in a conventional equivalent static data holding circuit. In addition, soft error resistance similar to that of the dynamic data holding circuit shown in FIG. 6 in reference 1 can be expected.

As explained above, according to the first embodiment, resistance to soft errors can be improved, enabling the data to be held stably. Moreover, adding a small number of transistors enables a static data holding circuit to be formed.

Second Embodiment

Next, a semiconductor integrated circuit including a flip-flop according to a second embodiment of the present invention will be explained.

Figure 2:
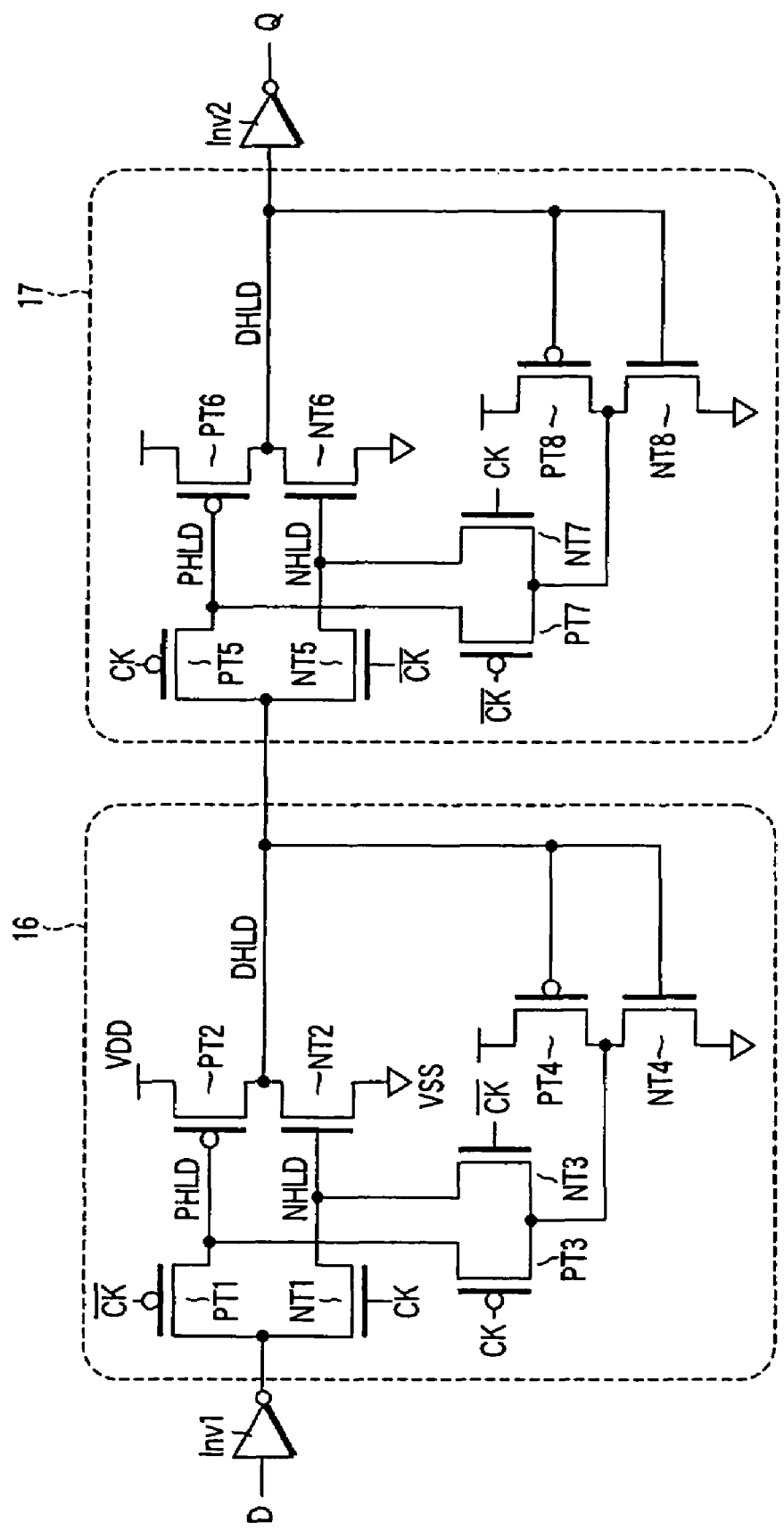
FIG. 2 is a circuit diagram showing the configuration of a flip-flop according to a second embodiment of the present invention.

FIG. 2 is a circuit diagram showing the configuration of a flip-flop according to the second embodiment.

The flip-flop is such that two units of the static data holding circuit of the first embodiment are connected in series. As shown in FIG. 2, the flip-flop includes a static data holding circuit 16 in the front stage which takes in input data D via an inverter Inv1 and holds the data and a static data holding circuit 17 in the back stage which takes in the output data of the front stage and holds the data. The static data holding circuit 16 has the same configuration as in the first embodiment. The static data holding circuit 17 comprises a data holding section including a p-channel MOS transistor PT8 and an n-channel MOS transistor NT8, a pull-up circuit including a p-channel MOS transistor PT5 and a p-channel MOS transistor PT6, a pull-down circuit including an n-channel MOS transistor NT5 and an n-channel MOS transistor NT6, a first feedback circuit including a p-channel MOS transistor PT7, and a second feedback circuit including an n-channel MOS transistor NT7. The static data holding circuit 17 in the back stage outputs an output signal Q via an inverter Inv2.

The static data holding circuits 16 and 17 have the effect of providing the same resistance to soft errors as in the first embodiment. Therefore, according to the second embodiment, resistance to soft errors can be improved, enabling the data to be held stably. Moreover, a flip-flop of the second embodiment can be configured using a smaller number of transistors than a conventional equivalent flip-flop.

Third Embodiment

Next, a semiconductor integrated circuit including an inverter circuit according to a third embodiment of the present invention will be explained.

Figure 3:
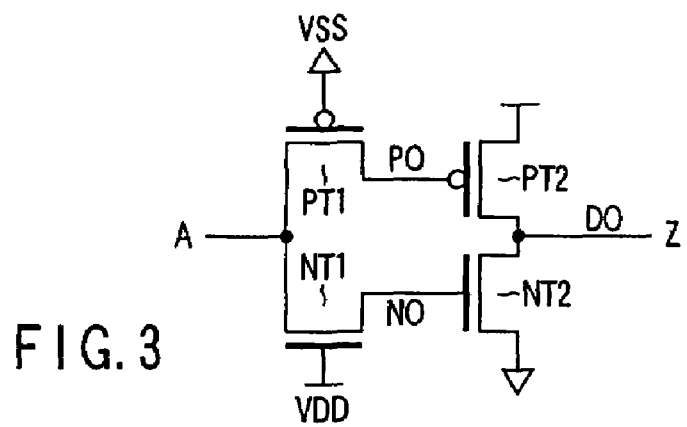
FIG. 3 is a circuit diagram showing the configuration of an inverter circuit according to a third embodiment of the present invention.

FIG. 3 is a circuit diagram showing the configuration of an inverter circuit according to the third embodiment.

The inverter circuit comprises a first gate circuit formed of a p-channel MOS transistor PT1, a pull-up circuit including a p-channel MOS transistor PT2, a second gate circuit formed of an n-channel MOS transistor NT1, and a pull-down circuit including an n-channel MOS transistor NT2. The p-channel MOS transistor PT1 introduces input data A as a pull-up control signal into node PO. The p-channel MOS transistor PT2 has the data at node PO input directly to its gate and pulls up an output signal Z when the input data A takes one value or "0." The n-channel MOS transistor NT1 introduces input data A as a pull-down control signal into node NO. The n-channel MOS transistor NT2 has the data at node NO input directly to its gate and pulls down the output signal Z when the input data A has the other value or "1."

Hereinafter, the connections of the inverter circuit shown in FIG. 3 will be described.

The input data A is supplied to one end of the current path of the p-channel MOS transistor PT1 and to one end of the current path of the n-channel MOS transistor NT1. The other end (node PO) of the current path of the p-channel MOS transistor PT1 is connected to the gate of the p-channel MOS transistor PT2. The other end (node NO) of the current path of the n-channel MOS transistor NT1 is connected to the gate of the n-channel MOS transistor NT2. One end of the current path of the p-channel MOS transistor PT2 and one end of the current path of the n-channel MOS transistor NT2 are connected in series at a junction point (node DO). At the junction point, an output signal Z is output.

A reference voltage $V_{SS}$ (e.g., ground potential) is supplied to the gate of the p-channel MOS transistor PT1. A power supply voltage $V_{DD}$ is supplied to the gate of the n-channel MOS transistor NT1. The power supply voltage $V_{DD}$ is supplied to the other end of the current path of the p-channel MOS transistor PT2. The reference voltage $V_{SS}$ (e.g., ground potential) is supplied to the other end of the current path of the n-channel MOS transistor NT2.

In the inverter circuit of the third embodiment, the gate of the p-channel MOS transistor PT2 and the gate of the n-channel MOS transistor NT2 are not shared with each other. That is, these gates are not connected directly to each other. The input data A is supplied to the gate of the p-channel MOS transistor PT2 via the first gate circuit formed of the p-channel MOS transistor PT1. In addition, the input data A is supplied to the gate of the n-channel MOS transistor NT2 via the second gate circuit formed of the n-channel MOS transistor NT1.

Next, the operation of the inverter circuit of the third embodiment will be explained.

In the inverter circuit of FIG. 3, the input data A is supplied to the gate of the p-channel MOS transistor PT2 via the first gate circuit formed of the p-channel MOS transistor PT1 constantly in the on state. The input data A is also supplied to the gate of the n-channel MOS transistor NT2 via the second gate circuit formed of the n-channel MOS transistor NT1 constantly in the on state. Therefore, as compared with a case where the input data A is input directly to the gate, there is a potential difference of the circuit threshold value Vth−P of the p-channel MOS transistor PT1 between the control signal input to the gate of the p-channel MOS transistor PT2 and the input data A. Similarly, there is a potential difference of the circuit threshold value Vth−N of the n-channel MOS transistor NT1 between the control signal input to the gate of the n-channel MOS transistor NT2 and the input data A.

If a soft error has occurred at the output node of the cell connected to the front stage of the inverter circuit, the inverter circuit has as high resistance to soft errors as corresponds to the circuit threshold value of the p-channel MOS transistor PT1, or has as high resistance to soft errors as corresponds to the circuit threshold value of the n-channel MOS transistor NT1.

When the output of the cell in the front stage of the inverter circuit is "0," the p-channel MOS transistor PT2 goes on and the n-channel MOS transistor NT2 goes off. In this case, if the output of the cell in the front stage has changed from "0" to "1" due to a soft error, the p-channel MOS transistor PT2 changes from on to off and the n-channel MOS transistor NT2 changes from off to on. Therefore, a soft error can occur in the output signal Z. A voltage lower than the level "1" caused by the soft error by the circuit threshold value of the p-channel MOS transistor PT1 is applied to the gate of the p-channel MOS transistor PT2 and a voltage lower than the level "1" caused by the soft error by the threshold value of the n-channel MOS transistor NT1 is applied to the gate of the n-channel MOS transistor NT2. Therefore, the inverter circuit has higher resistance to a soft error occurred in the cell in the front stage than in a case where "1" caused by a soft error is input directly to the gate.

Furthermore, when the output of the cell in the front stage of the inverter circuit is "1," the p-channel MOS transistor PT2 goes off and the n-channel MOS transistor NT2 goes on. In this case, if the output of the cell in the front stage has changed from "1" to "0" due to a soft error, the p-channel MOS transistor PT2 changes from off to on and the n-channel MOS transistor NT2 changes from on to off. Therefore, a soft error can occur in the output signal Z. However, a voltage higher than the level "0" caused by a soft error by the circuit threshold value of the p-channel MOS transistor PT1 is applied to the gate of the p-channel MOS transistor PT2 and a voltage higher than the level "0" caused by the soft error by the threshold value of the n-channel MOS transistor NT1 is applied to the gate of the n-channel MOS transistor NT2. Therefore, the inverter circuit has higher resistance to a soft error occurred in the cell in the front stage than in a case where "0" caused by a soft error is input directly to the gate.

In the inverter circuit of FIG. 3, if a soft error has occurred in the data of the output signal, the data is corrected using the data at the node PO or node NO with no error. When the input data A is "0," the data at the node PO and at node NO are "0," with the result that the p-channel MOS transistor PT2 goes on and the n-channel MOS transistor NT2 goes off. In this case, if the data at the node PO has changed from "0" to "1" due to a soft error, the transistor PT2 changes from on to off. Therefore, a soft error can occur in the data of the output signal Z, but no soft error occurs in the data at the node NO. The reason is that only an error from "0" to "1" occurs in the p-channel MOS transistor and only an error from "1" to "0" occurs in the n-channel MOS transistor. If a soft error has occurred in the data at the node PO and the data has changed from "0" to "1," the p-channel MOS transistor PT2 changes from on to off. At this time, the n-channel MOS transistor NT2 is off, which brings the node DO into the floating state. However, the data at the node DO is held by parasitic capacitance or the like.

Furthermore, when the input data A is "1," the data at the node PO and at node NO are "1," with the result that the p-channel MOS transistor PT2 goes off and the n-channel MOS transistor NT2 goes on. In this case, if the data at the node NO has changed from "1" to "0" due to a soft error, the n-channel transistor NT2 changes from on to off. Therefore, a soft error can occur in the data of the output signal, but no soft error occurs in the data at the node PO. When a soft error has occurred in the data at the node NO and the data has changed from "1" to "0," the n-channel MOS transistor NT2 changes from on to off. At this time, the p-channel MOS transistor PT2 is off, which brings the node DO into the floating state. However, the data at the node DO is held by parasitic capacitance or the like.

Furthermore, there is a possibility that a soft error occurred in the data at one of the node PO and node NO is transmitted to the other of the node PO and node NO via the first gate circuit formed of the p-channel MOS transistor PT1 constantly in the on state and the second gate circuit formed of the n-channel MOS transistor NT1 constantly in the on state. However, as described above, a potential difference bewtween the circuit threshold value Vth−P of the p-channel MOS transistor PT1 and the circuit threshold value Vth−N of the n-channel MOS transistor NT1 have developed. Therefore, if a soft error that changes the data at the node PO from "0" to "1" has occurred, it is unlikely that the data at the node NO will change from "0" to "1." Similarly, if a soft error that changes the data at the node NO from "1" to "0" has occurred, it is unlikely that the data at the node PO will change from "1" to "0."

Therefore, according to the third embodiment, it is possible to provide an inverter circuit which has high resistance to soft errors.

Fourth Embodiment

Next, a semiconductor integrated circuit including a buffer circuit according to a fourth embodiment of the present invention will be explained.

Figure 4:
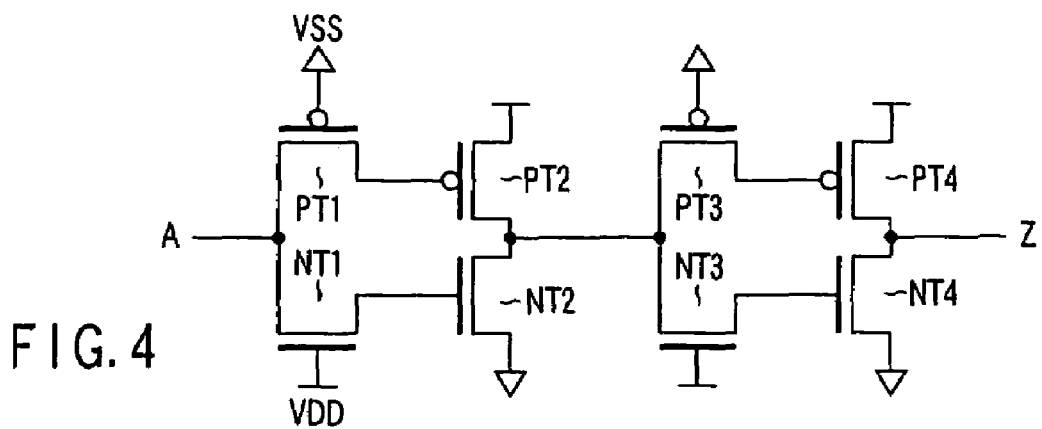
FIG. 4 is a circuit diagram showing the configuration of a buffer circuit according to a fourth embodiment of the present invention.

FIG. 4 is a circuit diagram showing the configuration of a buffer circuit of the fourth embodiment.

The buffer circuit is such that two units of the inverter circuit of the third embodiment are connected in series. As shown in FIG. 4, the inverter circuit includes an inverter circuit in the front stage to which input data A is input and an inverter circuit in the back stage to which the output data from the front stage is input. The inverter circuit in the back stage outputs an output signal Z.

In the buffer circuit of the fourth embodiment, the gate of the p-channel MOS transistor PT2 and the gate of the n-channel MOS transistor NT2 are not shared with each other and the gate of the p-channel MOS transistor PT4 and the gate of the n-channel MOS transistor NT4 are not shared with each other. That is, the gate of the transistor PT2 and the gate of the transistor NT2 are not connected directly with each other. The gate of the transistor PT4 and the gate of the transistor NT4 are not connected directly with each other.

Input data A is supplied to the gate of the p-channel MOS transistor PT2 via a first gate circuit formed of the p-channel MOS transistor PT1. Input data A is supplied to the gate of the n-channel MOS transistor NT2 via a second gate circuit formed of the n-channel MOS transistor NT1.

Furthermore, the output of the inverter circuit in the front stage is input to the gate of the p-channel MOS transistor PT4 via a third gate circuit formed of the p-channel MOS transistor PT3. The output of the inverter circuit in the front stage is input to the gate of the n-channel MOS transistor NT4 via a fourth gate circuit formed of the n-channel MOS transistor NT3.

The fourth embodiment has the effect of providing the same resistance to soft errors as in the third embodiment. Therefore, with the inverter circuit of the fourth embodiment, resistance to soft errors can be improved.

Fifth Embodiment

Next, a semiconductor integrated circuit including a NAND circuit according to a fifth embodiment of the present invention will be explained.

Figure 5:
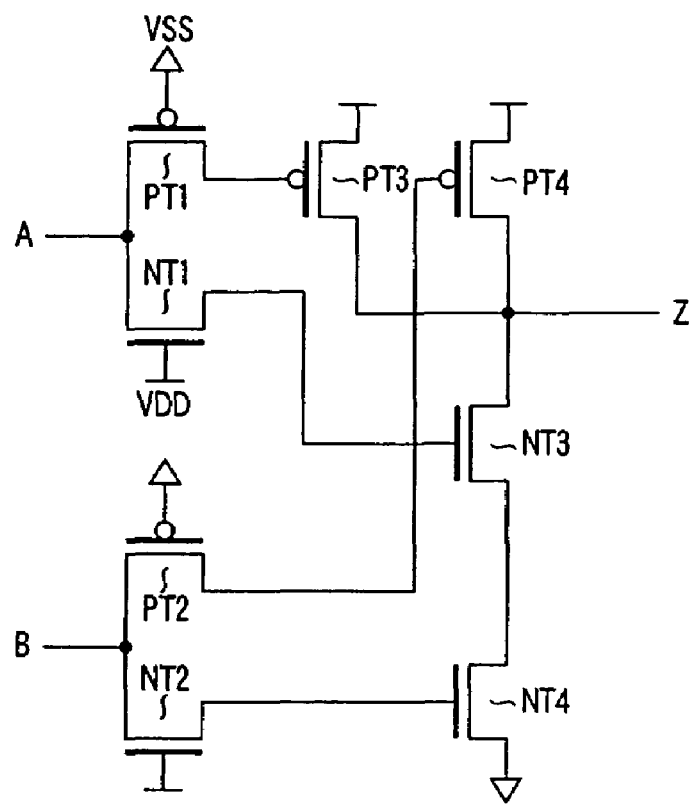
FIG. 5 is a circuit diagram showing the configuration of a NAND circuit according to a fifth embodiment of the present invention.

FIG. 5 is a circuit diagram showing the configuration of a NAND circuit of the fifth embodiment. The NAND circuit comprises a first gate circuit formed of a p-channel MOS transistor PT1, a second gate circuit formed of an n-channel MOS transistor NT1, a third gate circuit formed of a p-channel MOS transistor PT2, a fourth gate circuit formed of an n-channel MOS transistor NT2, p-channel MOS transistors PT3, PT4 connected in parallel, and n-channel MOS transistors NT3, NT4 connected in series. One end of the current path of the p-channel MOS transistor PT3 and one end of the current path of the p-channel MOS transistor PT4 are connected in parallel with a power supply voltage $V_{DD}$. One end of the current path of the n-channel MOS transistor NT3 and one end of the current path of the n-channel MOS transistor NT4 are connected in series with a reference voltage $V_{SS}$.

The p-channel MOS transistor PT1 takes in input data A as a control signal for the p-channel MOS transistor PT3 constituting a NAND gate. The n-channel MOS transistor NT1 takes in input data A as a control signal for the n-channel MOS transistor NT3 constituting a NAND gate. The p-channel MOS transistor PT2 takes in input data B as a control signal for the p-channel MOS transistor PT4 constituting a NAND gate. The n-channel MOS transistor NT2 takes in input data B as a control signal for the n-channel MOS transistor NT4 constituting a NAND gate. The p-channel MOS transistors PT3, PT4 pull up the output signal Z when the input data A is "0" or the input data B is "0." The n-channel MOS transistors NT3, NT4 pull down the output signal Z when the input data A is "1" and the input data B is "1."

The reference voltage $V_{SS}$ is input directly to the gate of the p-channel MOS transistor PT1 and to the gate of the p-channel MOS transistor PT2, with the result that the transistors PT1, PT2 are always on. The power supply voltage $V_{DD}$ is input directly to the gate of the n-channel MOS transistor NT1 and to the gate of the n-channel MOS transistor NT2, with the result that the transistors NT1, NT2 are always on.

In the NAND circuit of the fifth embodiment, the gate of the p-channel MOS transistor PT3 and the gate of the n-channel MOS transistor NT3 are not shared with each other. That is, the gate of the transistor PT3 and the gate of the transistor NT3 are not connected directly with each other. Input data A is supplied to the gate of the p-channel MOS transistor PT3 via a first gate circuit formed of the p-channel MOS transistor PT1. Input data A is supplied to the gate of the n-channel MOS transistor NT3 via a second gate circuit formed of the n-channel MOS transistor NT1.

Furthermore, the gate of the p-channel MOS transistor PT4 and the gate of the n-channel MOS transistor NT4 are not shared with each other. That is, the gate of the transistor PT4 and the gate of the transistor NT4 are not connected directly with each other. Input data B is supplied to the gate of the p-channel MOS transistor PT4 via a third gate circuit formed of the p-channel MOS transistor PT2. Input data B is supplied to the gate of the n-channel MOS transistor NT4 via a fourth gate circuit formed of the n-channel MOS transistor NT2.

The fifth embodiment has the effect of providing the same resistance to soft errors as in the third embodiment. Therefore, with the NAND circuit of the fifth embodiment, resistance to soft errors can be improved. As described above, if similar measures are taken to protect the input data, resistance to soft errors can be improved. More specifically, a gate circuit formed of a p-channel MOS transistor is connected to the gate of a p-channel MOS transistor and a gate circuit formed of an n-channel MOS transistor is connected to the gate of an n-channel MOS transistor, thereby improving resistance to soft errors even in other logic circuits.

Sixth Embodiment

Next, a semiconductor integrated circuit including a static flip-flop circuit according to a sixth embodiment of the present invention will be explained.

FIG. 6 is a circuit diagram showing the configuration of the flip-flop of the sixth embodiment.

The flip-flop is such that, in the flip-flop of the second embodiment, the transistors PT4 and NT4 and the transistors PT8 and NT8 corresponding to the data holding section are replaced with the inverter circuit of the third embodiment.

A comparison between the flip-flop of FIG. 6 and the flip-flop of FIG. 2 has shown that the CMOS inverter formed of the transistors PT4 and NT4 in FIG. 6 corresponds to the inverter in the data holding section formed of the transistors PT4 and NT4 in FIG. 2. Furthermore, the CMOS inverter formed of the transistors PT8 and NT8 in FIG. 6 corresponds to the inverter in the data holding section formed of the transistors PT8 and NT8 in FIG. 2.

The signal at node DHLD1 is supplied to the gate of the p-channel MOS transistor PT4 via a fifth gate circuit formed of a p-channel MOS transistor PT9. The signal at node DHLD1 is supplied to the gate of the n-channel MOS transistor NT4 via a sixth gate circuit formed of an n-channel MOS transistor NT9. The signal at node DHLD2 is supplied to the gate of the p-channel MOS transistor PT8 via a seventh gate circuit formed of a p-channel MOS transistor PT10. The signal at node DHLD2 is supplied to the gate of the n-channel MOS transistor NT8 via an eighth gate circuit formed of an n-channel MOS transistor NT10.

Moreover, the reference voltage $V_{SS}$ is supplied directly to the gate of the p-channel MOS transistor PT9 and to the gate of the p-channel MOS transistor PT10. As a result, the p-channel MOS transistors PT9 and PT10 are always on. In addition, the power supply voltage $V_{DD}$ is supplied directly to the gate of the n-channel MOS transistor NT9 and to the gate of the n-channel MOS transistor NT10. As a result, the n-channel MOS transistors NT9 and NT10 are always on.

In the data holding circuit of FIG. 1 constituting the flip-flop of FIG. 2, if a soft error has occurred in the data at node DHLD, the data is corrected using the data at the node PHLD or node NHLD where no error has occurred. However, if a soft error occurred at the node DHLD is fed back to the data at the node PHLD or node NHLD by the first feedback circuit 14 or second feedback circuit 15, the data held in the data holding circuit is inverted and the inverted data is held stably. Replacing the inverter circuit (transistors PT4 and NT4 and transistors PT8 and NT8) constituting the data holding circuit with the inverter of the third embodiment makes it possible to realize a data holding circuit which has resistance to a soft error occurring in the data at the node DHLD. The same effect is produced in the static flip-flop of the sixth embodiment. Therefore, it is possible to form a flip-flop which has resistance to soft errors occurring in the data at node DHLD1 and at node DHLD2.

Seventh Embodiment

Next, a semiconductor integrated circuit including a static flip-flop circuit according to a seventh embodiment of the present invention will be explained.

Figure 7:
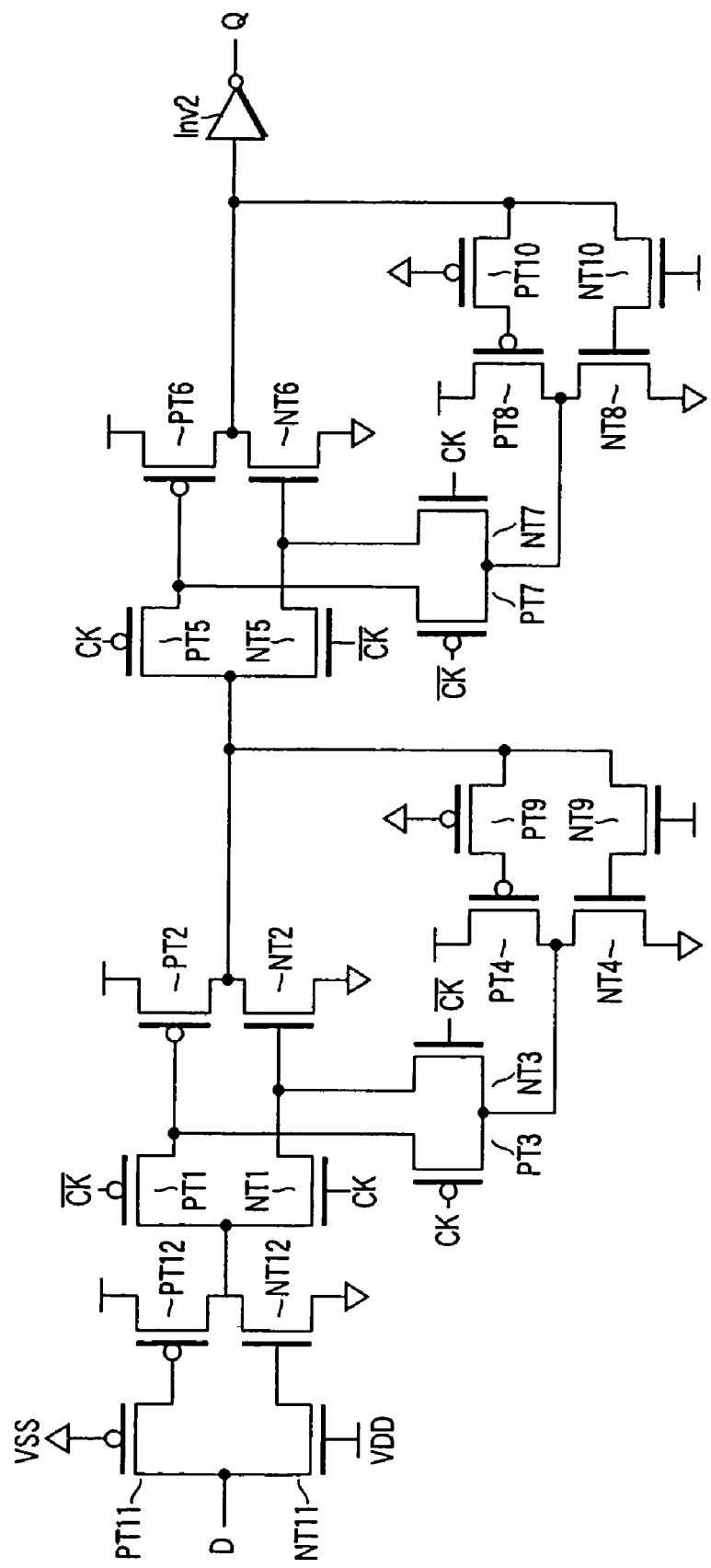
FIG. 7 is a circuit diagram showing the configuration of a flip-flop according to a seventh embodiment of the present invention.

FIG. 7 is a circuit diagram showing the configuration of a flip-flop of the seventh embodiment.

The flip-flop is such that, in the flip-flop of the sixth embodiment, the inverter Inv1 to which input data D is input is replaced with the inverter circuit of the third embodiment.

A comparison between the flip-flop of FIG. 7 and the flip-flop of FIG. 6 has shown that the CMOS inverter formed of transistors PT12 and NT12 in FIG. 7 corresponds to the inverter Inv1 of FIG. 6. Input data D is input to the gate of the p-channel MOS transistor PT12 via a ninth gate circuit formed of the p-channel MOS transistor PT11. In addition, input data D is also input to the gate of the n-channel MOS transistor NT12 via a tenth gate circuit formed of the n-channel MOS transistor NT11.

The reference voltage $V_{SS}$ is supplied directly to the gate of the p-channel MOS transistor PT11. As a result, the p-channel MOS transistor PT11 is always on. Moreover, the power supply voltage $V_{DD}$ is supplied directly to the gate of the n-channel MOS transistor NT11. As a result, the n-channel MOS transistor NT11 is always on.

As described above, in the seventh embodiment, the inverter to which the input data is supplied is replaced with the inverter of the third embodiment, which makes it possible to form a flip-flop that has resistance even to a soft error occurring at the output node of the cells connected to the front stage of the flip-flop.

Eighth Embodiment

Next, a semiconductor integrated circuit according to an eighth embodiment of the present invention will be explained.

Figure 8:
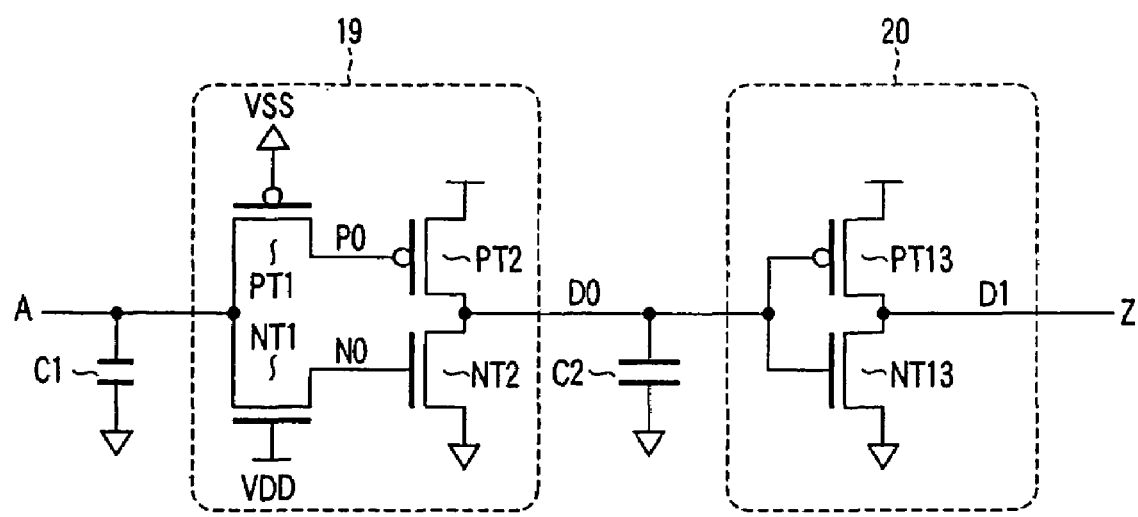
FIG. 8 is a circuit diagram showing the configuration of a buffer circuit according to an eighth embodiment of the present invention.

FIG. 8 is a circuit diagram showing the configuration of a semiconductor integrated circuit according to the eighth embodiment. FIG. 8 shows a circuit which uses the embodiments of the present invention efficiently in chip design (or FIG. 8 shows a chip design method).

In the semiconductor integrated circuit, the inverter circuit of the third embodiment is used as an inverter 19 in the front stage and an ordinary inverter circuit is used as an inverter circuit 20 in the back stage.

When the load capacitance of the preceding stage of the inverter circuit 19 is small, a cell having resistance to a soft error occurring at the output node of the cell in the preceding stage (e.g., the inverter circuit of the third embodiment) is used. When the load capacitance of the preceding stage of the inverter circuit 20 is large, a cell having no resistance to a soft error occurring at the output node of the cell in the preceding stage (e.g., a conventional inverter circuit) is used.

When the load capacitance of the preceding stage is small, it is highly likely that the input data will be inverted due to a soft error occurring at the output node of the cell in the preceding stage. In contrast, when the load capacitance of the preceding stage is large, it is unlikely that the input data will be inverted due to a soft error occurring at the output node of the cell in the preceding stage. Therefore, when the load capacitance of the preceding stage is small, a cell having resistance to a soft error occurring at the output node is used.

When the load capacitance of the preceding stage is large, a cell having no resistance to a soft error occurring at the output node is used. By doing this, it is possible to design a chip efficiently.

A cell having resistance to a soft error uses more transistors than a conventional cell having no resistance to a soft error. Therefore, if all of the cells are replaced with cells having resistance to soft errors, this results in a substantial increase in the circuit size. To avoid the shortcoming, soft-error-resistant cells are provided only in places needing these cells, which suppresses an increase in the circuit size as much as possible and makes it possible to design a chip having resistance to soft errors.

Hereinafter, the connections of the semiconductor integrated circuit shown in FIG. 8 will be described.

Input data A is supplied to one end of the current path of the p-channel MOS transistor PT1 and to one end of the current path of the n-channel MOS transistor NT1. The other end (node PO) of the current path of the p-channel MOS transistor PT1 is connected to the gate of the p-channel MOS transistor PT2. The other end (node NO) of the current path of the n-channel MOS transistor NT1 is connected to the gate of the n-channel MOS transistor NT2. One end of the current path of the p-channel MOS transistor PT2 is connected to one end of the current path of n-channel MOS transistor NT2 at a junction point (node DO). The junction point is connected to the gate of a p-channel MOS transistor PT13 and to the gate of an n-channel MOS transistor NT13. One end of the current path of the p-channel MOS transistor PT13 is connected to one end of the current path of n-channel MOS transistor NT13 at a junction point (node D1). At this junction point, an output signal Z is output.

A reference voltage $V_{SS}$ (e.g., ground potential) is supplied to the gate of the p-channel MOS transistor PT1. A power supply voltage $V_{DD}$ is supplied to the gate of the n-channel MOS transistor NT1. The power supply voltage $V_{DD}$ is also supplied to the other end of the current path of the p-channel MOS transistor PT2. The reference voltage $V_{SS}$ is supplied to the other end of the current path of the n-channel MOS transistor NT2. Moreover, the power supply voltage $V_{DD}$ is supplied to the other end of the current path of the p-channel MOS transistor PT13. The reference voltage $V_{SS}$ is supplied to the other end of the current path of the n-channel MOS transistor NT13. One end of the current path of the p-channel MOS transistor PT1 and one end of the current path of the n-channel MOS transistor NT1 each have a small load capacitance C1. Node D0 has a larger load capacitance C2 than the load capacitance C1.

The semiconductor integrated circuit of the eighth embodiment has the following configuration.

The inverter circuit includes the p-channel MOS transistor PT2 and the n-channel MOS transistor NT2. The reference voltage $V_{SS}$ is supplied to the gate of the p-channel MOS transistor PT1. The p-channel MOS transistor PT1 controls the signal input to the gate of the p-channel MOS transistor PT2. The power supply voltage $V_{DD}$ is supplied to the gate of the n-channel MOS transistor NT1. The n-channel MOS transistor NT1 controls the signal input to the gate of the n-channel MOS transistor NT2. The inverter circuit 20 includes the p-channel MOS transistor PT13 and the n-channel MOS transistor NT13. A first circuit having a small load capacitance is connected to the preceding stage of the p-channel MOS transistor PT1 and n-channel MOS transistor NT1. A second circuit having a larger load capacitance than that of the first circuit is connected to the preceding stage of the inverter circuit 20.

With the embodiments of the present invention, even if a soft error has occurred, the soft error can be corrected and the final output signal can be kept at the good value. In addition, it is possible to realize a logic circuit which has a simple configuration and can operate at high speed. The logic circuits explained in the embodiments of the present invention are basic circuit elements and may be applied to other various circuits. The adverse effect of soft errors in those circuits is prevented from propagating, which prevents the chip from operating erroneously.

As described above, with the embodiments of the present invention, it is possible to provide a semiconductor integrated circuit including a data holding circuit which can hold data stably, suppresses an increase in the circuit size, and has high resistance to soft errors.

Furthermore, the aforementioned embodiments can be implemented not only separately but also by combining them suitably. Since the above-described embodiments include various stages of the invention, various stages of the invention can be extracted by combining suitably a plurality of component elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
an inverter that inverts and outputs first output data;
a first pull-up circuit which takes in, as a pull-up control signal, input data input in synchronization with a clock signal and, when the pull-up control signal takes one value, pulls up the first output data input to the inverter, the first pull-up circuit including a first gate circuit and a first p-channel MOS transistor, the input data being supplied to a gate of the first p-channel MOS transistor via the first gate circuit;
a first pull-down circuit which takes in, as a pull-down control signal, the input data input in synchronization with the clock signal and, when the pull-down control signal takes a second value, pulls down the first output data input to the inverter, the first pull-down circuit including a second gate circuit and a first n-channel MOS transistor, the input data being supplied to a gate of the first n-channel MOS transistor via the second gate circuit;
a first feedback circuit formed of a first path including a second p-channel MOS transistor, the first path feeding back a first feedback signal corresponding to the first output data to the gate of the first p-channel MOS transistor included in the first pull-up circuit; and
a second feedback circuit formed of a second path including a second n-channel MOS transistor, the second path being separate from the first path, the second path feeding back a second feedback signal corresponding to the first output data to the gate of the first n-channel MOS transistor included in the first pull-down circuit,
wherein a power supply voltage is supplied to a first end of a current path of the first p-channel MOS transistor, a reference voltage is supplied to a first end of a current path of the first n-channel MOS transistor, and a second end of the current path of the first p-channel MOS transistor is directly connected to a second end of the current path of the first n-channel MOS transistor, wherein the first gate circuit, the second gate circuit, the first feedback circuit, and the second feedback circuit are supplied with clock signals used for controlling an operation-enabled state and an operation-disabled state:

when the first gate circuit is supplied with a clock signal having a polarity that enables the first gate circuit, the second gate circuit receives a clock signal having a polarity that enables the second gate circuit, the first feedback circuit receives a clock signal having a polarity that disables the first feedback circuit, and the second feedback circuit receives a clock signal having a polarity that disables the second feedback circuit, when the first gate circuit is supplied with a clock signal having a polarity that disables the first gate circuit, the second gate circuit receives a clock signal having a polarity that disables the second gate circuit, the first feedback circuit receives a clock signal having a polarity that enables the first feedback circuit, and the second feedback circuit receives a clock signal having a polarity that enables the second feedback circuit.

2. The semiconductor integrated circuit according to claim 1, wherein the inverter includes inverter circuitry formed of a third p-channel MOS transistor and a third n-channel MOS transistor, and the first output data is input to the input section of the inverter circuitry and the output section of the inverter circuitry is connected to the input sections of the first and second feedback circuits.

3. The semiconductor integrated circuit according to claim 1, wherein the first gate circuit takes in the input data as the pull-up control signal in synchronization with an inverted clock signal obtained by inverting the phase of the clock signal and holds the pull-up control signal, and the first p-channel MOS transistor has the pull-up control signal input to its gate and, when the pull-up control signal takes the one value, pulls up the first output data input to the inverter.

4. The semiconductor integrated circuit according to claim 3, wherein the first gate circuit includes a third p-channel MOS transistor having a first current path and a first gate, the input data is supplied to one end of the first current path, the other end of the first current path is connected to the gate of the first p-channel MOS transistor, and the inverted clock signal is supplied to the first gate.

5. The semiconductor integrated circuit according to claim 3, wherein the second gate circuit takes in the input data as the pull-down control signal in synchronization with the clock signal and holds the pull-down control signal, and the first n-channel MOS transistor has the pull-down control signal input to its gate and, when the pull-down control signal takes the second value, pulls down the first output data input to the inverter.

6. The semiconductor integrated circuit according to claim 5, wherein the second gate circuit includes a third n-channel MOS transistor having a second current path and a second gate, the input data is supplied to one end of the second current path, the other end of the second current path is connected to the gate of the first n-channel MOS transistor, and the clock signal is supplied to the second gate.

7. The semiconductor integrated circuit according to claim 5, wherein the second p-channel MOS transistor included in the first feedback circuit has a first current path and a first gate, one end of the first current path is connected to the output section of inverter circuitry included in the inverter, the other end of the first current path is connected to the gate of the first p-channel MOS transistor included in the first pull-up circuit, and the clock signal is supplied to the first gate, the second n-channel MOS transistor included in the second feedback circuit has a second current path and a second gate, and one end of the second current path is connected to the output section of the inverter circuitry included in the inverter, the other end of the second current path is connected to the gate of the first n-channel MOS transistor included in the first pull-down circuit, and the inverted clock signal is supplied to the second gate.

8. The semiconductor integrated circuit according to claim 1, further comprising:

a second data holding section which holds second output data;

a second pull-up circuit which takes in, as a pull-up control signal, the first output data input in synchronization with the clock signal and, when the pull-up control signal takes one value, pulls up the second output data held in the second data holding section.

9. The semiconductor integrated circuit according to claim 2, further comprising:

a second p-channel MOS transistor which has a first current path and a first gate, the first output data being supplied to one end of the first current path, a reference voltage being supplied to the first gate, and the other end of the first current path being connected to the gate of the first p-channel MOS transistor included in the first data holding section; and a second n-channel MOS transistor which has a second current path and a second gate, the first output data being supplied to one end of the second current path, a power supply voltage being supplied to the second gate, and the other end of the second current path being connected to the gate of the first n-channel MOS transistor included in the first data holding section.

10. The semiconductor integrated circuit according to claim 9, wherein two stages of the circuits described in claim 9 are connected in series.

11. The semiconductor integrated circuit according to claim 9, further comprising:

an inverter which is provided in the preceding stage of the first pull-up circuit and the first pull-down circuit and which includes a third p-channel MOS transistor and a third n channel MOS transistor, the third p-channel MOS transistor having a third current path and a third gate, a first control signal-being input to the third gate and the power supply voltage being supplied to one end of the third current path, and the third n-channel MOS transistor having a fourth current path and a fourth gate, a second control signal being input to the fourth gate and the reference voltage being supplied to one end of the fourth current path;

a fourth p-channel MOS transistor which is connected to the third gate of the third p-channel MOS transistor included in the inverter and which has a fifth current path and a fifth gate, the input data being input to one end of the fifth current path, the first control signal being output at the other end of the fifth current path, and the reference voltage being supplied to the fifth gate; and a fourth n-channel MOS transistor which is connected to the fourth gate of the third n-channel MOS transistor included in the inverter and which has a sixth current path and a sixth gate, the input data being input to one end of the sixth current path, the second control signal being output at the other end of the sixth current path, and the power supply voltage being supplied to the sixth gate.

12. The semiconductor integrated circuit according to claim 11, wherein two stages of the circuits described in claim 11 are connected in series.

* * * * *